United States Patent
Qin et al.

(10) Patent No.: US 10,700,488 B2
(45) Date of Patent: Jun. 30, 2020

(54) COB BONDING LASER DIODE INTERFACE MATING DEVICE

(71) Applicant: Wuhan Telecommunication Devices Co., Ltd., Hubei (CN)

(72) Inventors: Yan Qin, Hubei (CN); Fanrong Gao, Hubei (CN)

(73) Assignee: Wuhan Telecommunication Devices Co., Ltd., Wuhan (CN)

( * ) Notice: Subject to any disclaimer, the term of this patent is extended or adjusted under 35 U.S.C. 154(b) by 0 days.

(21) Appl. No.: 16/094,462

(22) PCT Filed: Dec. 16, 2016

(86) PCT No.: PCT/CN2016/110352
§ 371 (c)(1),
(2) Date: Oct. 17, 2018

(87) PCT Pub. No.: WO2017/181701
PCT Pub. Date: Oct. 26, 2017

(65) Prior Publication Data
US 2019/0131764 A1    May 2, 2019

(30) Foreign Application Priority Data

Apr. 19, 2016   (CN) .......................... 2016 1 0243402

(51) Int. Cl.
*H01S 5/022*     (2006.01)
*H01S 5/042*     (2006.01)
(Continued)

(52) U.S. Cl.
CPC ............ *H01S 5/02248* (2013.01); *G02B 6/42* (2013.01); *H01S 5/02276* (2013.01);
(Continued)

(58) Field of Classification Search
CPC ............... H01S 5/02248; H01S 5/0683; H01S 5/02276; H01S 5/042; H01S 5/02288;
(Continued)

(56) References Cited

U.S. PATENT DOCUMENTS 4,369,525 A  * 1/1983 Breton ................ H04B 10/564
                                                372/30
6,220,765 B1 * 4/2001 Tatoh .................. H01L 31/0203
                                                257/E31.117
(Continued)

FOREIGN PATENT DOCUMENTS

CN        1172369      2/1998
CN        2697672      5/2005
(Continued)

OTHER PUBLICATIONS

PCT International Search Report dated Mar. 17, 2017, PCT Patent Application PCT/CN2016/110352.
(Continued)

*Primary Examiner* — Xinning(Tom) Niu
(74) *Attorney, Agent, or Firm* — Vierra Magen Marcus LLP

(57) ABSTRACT

A COB bonding laser diode interface mating device comprises a laser diode and a driver integrated circuit (2). The laser diode includes a light-emitting chip (11). The light-emitting chip (11) is a bare die directly bonded to a circuit board. The driver integrated circuit (2) is a driver chip that is a packaged chip. The light-emitting chip (11) and the driver chip are connected through a capacitor-resistor network (3). The capacitor-resistor network (3) allows the driver integrated circuit (2) to provide a bias current and a modulation current to the laser diode such that the laser diode is in an activated state. The capacitor-resistor network (3) realizes interface mating between the COB bonding laser diode and the driver integrated circuit (2), thereby solving a problem that the interface mating cannot be easily achieved, reducing costs, and improving production efficiency.

7 Claims, 1 Drawing Sheet

(51) Int. Cl.
*H01S 5/0683* (2006.01)
*G02B 6/42* (2006.01)
*H01S 5/183* (2006.01)

(52) U.S. Cl.
CPC .......... *H01S 5/02288* (2013.01); *H01S 5/042* (2013.01); *H01S 5/0683* (2013.01); *H01S 5/06832* (2013.01); *H01S 5/0427* (2013.01); *H01S 5/183* (2013.01)

(58) Field of Classification Search
CPC .... H01S 5/183; H01S 5/06832; H01S 5/0427; G02B 6/42; G02B 6/4204; G02B 6/428; G02B 6/4296
See application file for complete search history.

(56) References Cited

U.S. PATENT DOCUMENTS

| | | | | |
|---|---|---|---|---|
| 7,843,979 | B2* | 11/2010 | Rees | H01S 5/042 |
| | | | | 372/38.02 |
| 2003/0002820 | A1* | 1/2003 | Nakanishi | H01S 5/02284 |
| | | | | 385/88 |
| 2005/0047461 | A1* | 3/2005 | Kihara | H01S 5/02212 |
| | | | | 372/43.01 |
| 2007/0127530 | A1* | 6/2007 | Pan | H01S 5/06832 |
| | | | | 372/38.02 |

FOREIGN PATENT DOCUMENTS

| | | |
|---|---|---|
| CN | 1717849 | 1/2006 |
| CN | 201804860 | 4/2011 |
| CN | 102244365 | 11/2011 |
| CN | 102549946 | 7/2012 |
| CN | 202373844 | 8/2012 |
| CN | 103036618 | 4/2013 |
| CN | 203632931 | 6/2014 |
| CN | 103984068 | 8/2014 |
| CN | 105739031 | 7/2016 |
| JP | 2002057175 | 2/2002 |

OTHER PUBLICATIONS

Chinese Office Action dated Mar. 2, 2017, Chinese Patent Application CN201610243402.3.

* cited by examiner

COB BONDING LASER DIODE INTERFACE MATING DEVICE

TECHNICAL FIELD

The present application relates to a laser diode interface mating device, and particularly to a COB bonding laser diode interface mating device.

BACKGROUND

A small hot plug and unplug module is a miniaturized pluggable optical module used in a 10 Gbit/s ethernet and an 8.5 Gbit/s optical fiber communication system. Such a module is designed to provide a higher access density with a smaller size and a lower cost, and eventually to improve access capacity for users.

In a current single channel device based on a coaxial scheme, header and cap account for a relatively high amount of the overall cost, while in a COB (Chip on Board) scheme, TO (transistor outline) head and cap may be omitted and thus it is advantageous in terms of material consumption and cost. In the COB scheme, a chip is directly bonded onto a circuit board, and a device-to-module assembling process may be eliminated. Precision of bonding between the chip and the circuit board can be ensured by using a high precision chip bonding apparatus.

A driver chip for the small hot plug and unplug module may be a bare die or a package chip. The package chip has advantages of good thermal dissipation and high performance-to-cost radio, but it cannot be easily mated to a COB bonded laser diode interface as one side of the package chip is a package body and the other side has wire-bondings. Accordingly, conventional small hot plug and unplug modules all include a laser diode based on the coaxial scheme, which has a high production cost as the header and cap included therein are cost-consuming and a complicate manufacture process as a device-to-module assembling procedure is needed, causing a low productivity.

Therefore, there is a need to design an interface mating device for the COB bonding laser diodes to solve the above problems.

SUMMARY

An object of the present application is to provide an interface mating device for COB-bonding a laser diode to a driver integrated circuit, which aims to solve the problem that the interfaces of the COB-bonding laser diode and the driver integrated circuit cannot be easily mated.

The present application may be implemented as follows:

The present application provides a COB-bonding laser diode interface mating device, including a laser diode and a driver integrated circuit, being characterized in that: the laser diode has a light-emitting chip that is a bare die directly bonded on a circuit board, the driver integrated circuit includes a driver chip that is a package chip, the light-emitting chip and the driver chip are connected by a capacitor-resistor network, and the capacitor-resistor network allows the driver integrated circuit to provide a bias current and a modulation current to the laser diode such that the laser diode is in an activated state.

Further, the capacitor-resistor network includes six capacitors, two resistors and two inductors.

Further, the laser diode has a backlight chip that is a bare die directly bonded on the circuit board.

Further, the laser diode has a lens covering on the light-emitting chip and the backlight chip.

Further, the lens is adhered to the circuit board.

Further, the driver chip is positioned outside the lens and connected to the capacitor-resistor network through circuit board wirings, and the capacitor-resistor network is connected to the light-emitting chip through circuit board wirings.

Further, the driver chip is also connected to a control circuit through circuit board wirings, and the control circuit is connected to the backlight chip through circuit board wirings. The light-emitting chip and the backlight chip are wire-bonded to wiring pads of the circuit board within the lens.

Further, the backlight chip receives backlight emitted from the light-emitting chip and reflected by the lens, and converts the optical signal into an electrical signal that is provided to the control circuit and then is fed back to the driver integrated circuit by the control circuit. Therefore, the driver integrated circuit may monitor the backlight in real-time so that it can maintain stable light-emitting of the light-emitting chip by stability of the backlight.

Further, the control circuit has an alarm and diagnostic module that can perform alarm and diagnostic operations based on a preset threshold.

The present application has the following advantageous effects:

The COB bonding laser diode interface mating device of the present application may realize interface mating between the COB bonding laser diode and the driver integrated circuit through the capacitor-resistor network, thereby solving the problem that the interface mating cannot be easily achieved. The COB bonding laser diode does not need a header and a cap as a conventional device does, which may reduce the cost, eliminate the device-to-module assembling procedure, simplify the device structure, reduce the number of manufacture processes and improve production efficiency.

BRIEF DESCRIPTION OF THE DRAWINGS

In order to describe technical solutions of prior arts or embodiments of the present application more clearly, accompanying drawings used in the description of the prior arts or the embodiments will be described briefly. It is obvious that the accompanying drawings described below relate only to some of embodiments of the present application, and for those skilled in the art, other drawings may be obtained based on such accompanying drawings without any inventive work.

REFERENCE SIGNS

11—light-emitting chip, 12—backlight chip, 13—lens, 2—driver integrated circuit, 3—capacitor-resistor (C-R) network, 4—control circuit.

DESCRIPTION OF EMBODIMENT

The technical solutions of embodiments of the present application will be described clearly and thoroughly with reference to the accompanying drawings. It is obvious that the described embodiments are only a part but not all of the embodiments of the present application. Other embodiments may be obtained by those skilled in the art based on embodiments described herein without any inventive work, and all of the embodiments are within the protection scope of the present invention.

Figure 1:
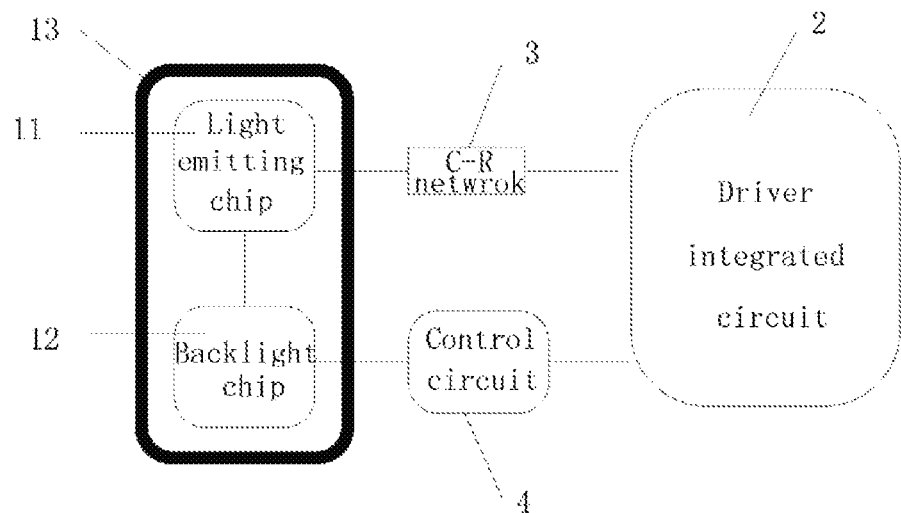
FIG. 1 is a block diagram showing a COB bonding laser diode interface mating device according to an embodiment of the present application.

Referring to FIG. 1, an embodiment of the present application provides a COB bonding laser diode interface mating device including a laser diode, a driver integrated circuit 2, a capacitor-resistor (C-R) network 3 and a control circuit 4.

As shown in FIG. 1, the laser diode may include a light-emitting chip 11, which is a VCSEL (Vertical Cavity Surface Emitting Laser) chip, and a backlight chip 12 that is a photoelectric chip. The light-emitting chip 11 and the backlight chip 12 both are bare dies, and they are directly bonded to a circuit board using conductive adhesive. The laser diode may further include a lens 13 covering on the light-emitting chip 11 and the backlight chip 12, and the lens 13 is adhered to the circuit board. The laser diode has an optical path as follows: laser is emitted from the light-emitting chip 11, a half of which is reflected by a semi-transparent semi-reflecting film to the backlight chip 12, and the other half passes through the semi-transparent semi-reflecting film and is converged by the lens 13, then leaving the laser diode.

As shown in FIG. 1, the driver integrated circuit 2 includes a driver chip that is a package chip positioned outside the lens 13 and connected to the light-emitting chip 11 through a capacitor-resistor network 3. In particular, the driver chip is connected to the capacitor-resistor network 3 through circuit board wirings, and the capacitor-resistor network 3 is connected to the light-emitting chip 11 through circuit board wirings. The light-emitting chip 11 is wire-bonded to wiring pads of the circuit board within the lens 13. By using the capacitor-resistor network 3, interface mating is achieved between the laser diode and the driver integrated circuit 2.

Figure 2:
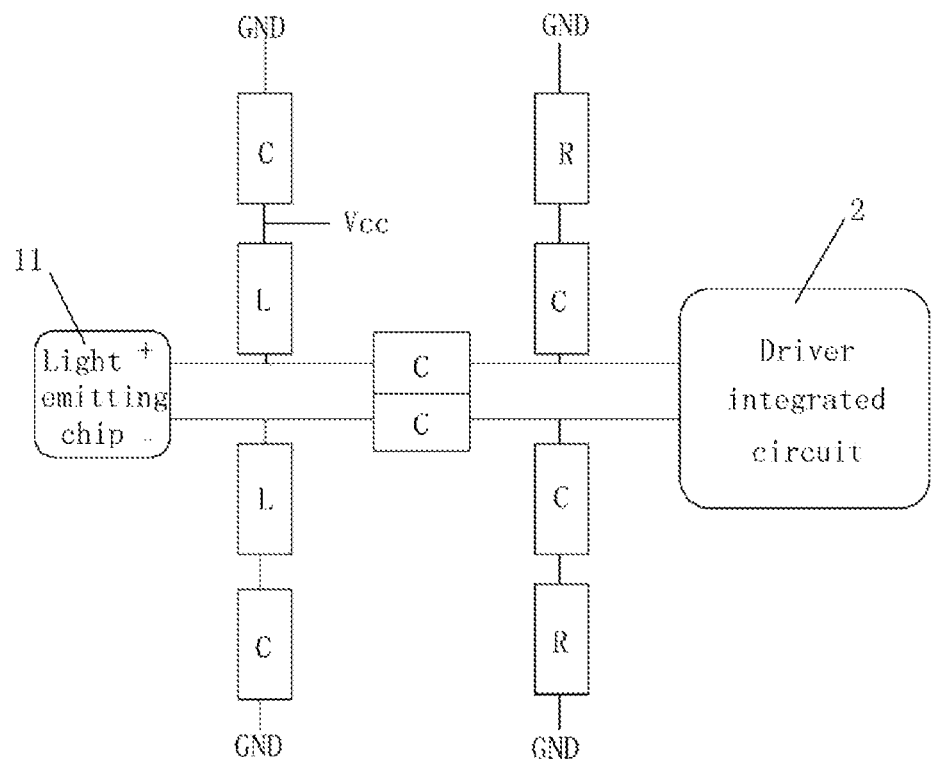
FIG. 2 is a circuit diagram showing a capacitor-resistor network of the COB bonding laser diode interface mating device according to an embodiment of the present application.

Referring to FIG. 2, there is shown a circuit diagram of the capacitor-resistor network 3 according to an embodiment of the present application. The capacitor-resistor network 3 includes six capacitors (C), two resistors (R) and two inductors (L), which are solder-bonded to the circuit board and connected in a relationship with each other. Values of the respective elements may be set as needed. The capacitor-resistor network 3 allows the driver integrated circuit 2 to provide a bias current and a modulation current to the laser diode such that the light-emitting chip 11 of the laser diode may be in activated state, and the optical power of the light-emitting chip 11 may be maintained stable.

Referring to FIG. 1, the backlight chip 12 and the driver chip 2 are connected through a control circuit 4, which may include a MCS-51 single chip microcomputer. The backlight chip 12 receives backlight emitted from the light-emitting chip 11 and reflected by the lens 13, and converts the optical signal into an electrical signal that is provided to the control circuit 4 and then is fed back to the driver integrated circuit 2 by the control circuit 4. Therefore, the driver integrated circuit 2 may monitor the backlight in real-time so that it can maintain stable light-emitting of the light-emitting chip 11 by stability of the backlight. The control circuit 4 may have an alarm and diagnostic module that performs alarm and diagnostic operations based on a preset threshold.

The above mentioned are only some preferred embodiments of the present application and are not to limit the present application. Modifications, equivalent replacement, changes or the like within the spirit and principle of the present application should be included in the protection scope of the present application.

The invention claimed is:

1. A COB-bonding laser diode interface mating device, comprising a laser diode and a driver integrated circuit, wherein:

the laser diode includes a light-emitting chip that is a bare die directly bonded on a circuit board, the driver integrated circuit includes a driver chip that is a package chip, the light-emitting chip and the driver chip are connected through a capacitor-resistor network, and the capacitor-resistor network allows the driver integrated circuit to provide a bias current and a modulation current to the laser diode such that the laser diode is in an activated state;

wherein the capacitor-resistor network includes a first, a second, a third, a fourth, a fifth and a sixth capacitors, a first and a second resistors, and a first and a second inductors, and wherein:

a differential signal positive end of the light-emitting chip is connected to an end of the first inductor, and another end of the first inductor is connected to the first capacitor and then to a GND;

a differential signal negative end of the light-emitting chip is connected to an end of the second inductor, and another end of the second inductor is connected to the second capacitor and then to the GND;

a differential signal positive end of the driver integrated circuit is connected to an end of the third capacitor, and another end of the third capacitor is connected to the first resistor and then to the GND;

a differential signal negative end of the driver integrated circuit is connected to an end of the fourth capacitor, and another end of the fourth capacitor is connected to the second resistor and then to the GND;

the fifth capacitor is connected between the differential signal positive end of the light-emitting chip and the differential signal positive end of the driver integrated circuit, and the sixth capacitor is connected between the differential signal negative end of the light-emitting chip and the differential signal negative end of the driver integrated circuit.

2. The COB-bonding laser diode interface mating device of claim 1 wherein the laser diode further includes a backlight chip that is a bare die directly bonded on the circuit board.

3. The COB-bonding laser diode interface mating device of claim 2 wherein the laser diode further includes a lens covering on the light-emitting chip and the backlight chip.

4. The COB-bonding laser diode interface mating device of claim 1 wherein the lens is adhered to the circuit board.

5. The COB-bonding laser diode interface mating device of claim 3 wherein the driver chip is positioned outside the lens and connected to the capacitor-resistor network and then to the light-emitting chip through circuit board wirings, and the light-emitting chip is wire-bonded to wiring pads of the circuit board within the lens.

6. The COB-bonding laser diode interface mating device of claim 2 wherein the backlight chip is connected to the driver chip through a control circuit, the backlight chip receives backlight emitted from the light-emitting chip and reflected by the lens, and converts the optical signal into an electrical signal that is provided to the control circuit and then is fed back to the driver integrated circuit by the control circuit such that the driver integrated circuit monitors the backlight in real-time so as to maintain stable light-emitting of the light-emitting chip by stability of the backlight.

7. The COB-bonding laser diode interface mating device of claim 6 wherein the control circuit has an alarm and diagnostic module that performs alarm and diagnostic operations based on a preset threshold.

\* \* \* \* \*